United States Patent [19]
Franz et al.

[11] Patent Number: 5,713,986
[45] Date of Patent: Feb. 3, 1998

[54] RESIST MATERIAL FOR DELETION OF COATINGS

[75] Inventors: Helmut Franz; Peter T. Dishart, both of Pittsburgh; Glenn E. Freeman, Tarentum; Frank J. Pazul, Lower Burrell; Robert T. Shumaker, Jr., Manorville; James F. Wilson, Worthington, all of Pa.

[73] Assignee: PPG Industries, Inc., Pittsburgh, Pa.

[21] Appl. No.: 574,504

[22] Filed: Dec. 19, 1995

[51] Int. Cl.⁶ .............................. C09D 5/20; C08L 1/00; C08L 5/04
[52] U.S. Cl. ............... 106/2; 106/162.71; 106/205.01; 427/154
[58] Field of Search .................. 106/2, 162.71, 106/205.01; 427/154, 155, 156, 287, 389.7

[56] References Cited

U.S. PATENT DOCUMENTS

| | | | |
|---|---|---|---|
| 3,655,545 | 4/1972 | Gillery et al. | 204/192 |
| 3,819,394 | 6/1974 | Schnebel, Jr. et al. | 428/304 |
| 3,839,066 | 10/1974 | Brenner | 427/155 |
| 3,853,576 | 12/1974 | Netznik | 427/259 |
| 3,895,156 | 7/1975 | Hammond | 428/216 |
| 3,922,394 | 11/1975 | Lozier | 427/388.4 |
| 3,962,488 | 6/1976 | Gillery | 427/109 |
| 4,304,812 | 12/1981 | Perkins | 427/155 |
| 4,440,830 | 4/1984 | Wempe | 428/352 |
| 4,548,967 | 10/1985 | Brown et al. | 427/154 |
| 4,622,075 | 11/1986 | Bogner | 427/155 |
| 4,877,654 | 10/1989 | Wilson | 427/387 |
| 4,898,789 | 2/1990 | Finley | 428/623 |
| 5,063,084 | 11/1991 | Nelson | 427/155 |
| 5,104,711 | 4/1992 | Marsek | 427/282 |
| 5,143,949 | 9/1992 | Grogan et al. | 427/155 |
| 5,186,978 | 2/1993 | Woodhall et al. | 427/156 |
| 5,225,314 | 7/1993 | Grosclaude et al. | 427/96 |
| 5,302,413 | 4/1994 | Woodhall et al. | 427/156 |
| 5,308,647 | 5/1994 | Lappi | 427/156 |
| 5,342,872 | 8/1994 | Huber | 428/294 |
| 5,350,445 | 9/1994 | Mikami et al. | 106/14.41 |
| 5,355,144 | 10/1994 | Walton et al. | 343/713 |
| 5,370,729 | 12/1994 | Man et al. | 106/2 |
| 5,407,700 | 4/1995 | Man et al. | 427/156 |
| 5,414,240 | 5/1995 | Carter et al. | 219/203 |
| 5,494,503 | 2/1996 | Ross et al. | 106/2 |
| 5,494,702 | 2/1996 | Blaine et al. | 427/156 |
| 5,550,182 | 8/1996 | Ely et al. | 524/557 |

*Primary Examiner*—Diana Dudash
*Attorney, Agent, or Firm*—Andrew C. Siminerio

[57] ABSTRACT

The present invention provides a method of forming a desired pattern with a coating on a substrate. The method includes the steps of applying a water soluble resist material in a predetermined pattern to a surface of a substrate, drying the resist material, depositing a coating on the surface of the substrate to form a coated substrate, wherein a portion of the coating overlays the resist material, and dissolving the resist material on the coated substrate with water to remove the resist material and corresponding overlaying coating and form a desired coating pattern on the substrate surface. The dissolving step preferably includes the step of directing high temperature and high pressure water sprays at the surface of the coated substrate to wash off the resist and corresponding overlaying coating. The removal of the resist material may include a prewash operation wherein the surface of the substrate is wetted with water and coating is allowed to soak.

The present invention also discloses a resist material for masking selected portions of a glass sheet to form a desired coating pattern. The resist material includes 1-20 wt. % water soluble polymer film former, 0 to 3 wt. % surfactant, 0 to 5 wt. % rinse aid and a solvent. The film former, surfactant and rinse aid are preferably all soluble in the solvent. In one particular embodiment of the invention, the film former is selected from a group consisting of polyvinylpyrrolidone, polyvinylalcohol, sodium alginate, hydroxyethyl cellulose and combinations thereof, the rinse agent is selected from a group consisting of sodium bicarbonate, sodium hydrogen phosphate, sodium sulfate, inorganic salts and combinations thereof, and the solvent is water, an organic solvent or a combination thereof.

13 Claims, No Drawings

RESIST MATERIAL FOR DELETION OF COATINGS

BACKGROUND OF THE INVENTION

1. Field of the Invention

The present invention relates to a liquid masking material and in particular to a water soluble resist material to mask selected portions of a glass sheet for subsequent deletion of a coating to form desired coating patterns.

2. Technical Considerations

It is common in the automotive and architectural products industries to coat glass sheets with transparent coatings to improve the overall solar performance of the product as disclosed in U.S. Pat. Nos. 3,655,545 to Gillery et al.; 3,962,488 to Gillery; and 4,898,789 to Finley. Transparent electroconductive coatings may also be used to fabricate electrically heatable transparencies as disclosed in U.S. Pat. No. 5,414,240 to Carter et al. and transparent glass antennas as disclosed in U.S. Pat. No. 5,355,144 to Walton et al. This coating may be applied in any of a number of well-known methods including magnetic sputtering vacuum deposition (MSVD) and chemical vapor deposition (CVD). In some instances, it is preferred that selected portions of the glass sheet not be coated, as for example, the edge of a glass sheet in an architectural glazing unit to facilitate adhesion of sealants or to form a predetermined electroconductive coating pattern for transparent glass antennas. The coating of selected portions of the glass may be accomplished by coating the entire glass surface and subsequently removing the unwanted coating by grinding off the unwanted coating with a grinding wheel or burning off the unwanted coating with a torch. As an alternative, a hard mask may be placed over the glass to cover selected areas of the glass prior to applying a coating so that the coating adheres only to the uncovered areas. However, using a hard mask has several shortcomings. In particular, the masks are generally recycled from the exit end of a coater used to deposit the desired coating, back to the entry end to be reused on subsequent glass sheets. In addition, it has been found that after repeated use, the masks must be cleaned to remove the built-up coating layer. Furthermore, the mask is limited to forming the exact pattern provided by the mask. Also, the mask may not provide a well defined deletion edge due to the thickness of the mask, causing a gradation of the coating layers in close proximity to the mask edge. This gradation in the coating is sometimes referred to as "ghosting".

It would be advantageous to provide a masking arrangement that would eliminate these problems. In particular, it would be advantageous to provide a strippable resist material that can be applied to the glass surface to mask the glass and prevent a coating from adhering to selected portions of the glass to form any desired pattern.

SUMMARY OF THE INVENTION

The present invention provides a method of forming a desired pattern with a coating on a substrate. The method includes the steps of applying a water soluble resist material in a predetermined pattern to a surface of a substrate, drying the resist material, depositing a coating on the surface of the substrate to form a coated substrate, wherein a portion of the coating overlays the resist material, and dissolving the resist material on the coated substrate with water to remove the resist material and corresponding overlaying coating and form a desired coating pattern on the substrate surface. The dissolving step preferably includes the step of directing high temperature and high pressure water sprays at the surface of the coated substrate to wash off the resist and corresponding overlaying coating. The removal of the resist material may include a prewash operation wherein the surface of the substrate is wetted with water and coating is allowed to soak.

The present invention also discloses a resist material for masking selected portions of a glass sheet to form a desired coating pattern. The resist material includes 1–20 wt. % water soluble polymer film former, 0 to 3 wt. % surfactant, 0 to 5 wt. % rinse aid and a solvent. The film former, surfactant and rinse aid are preferably all soluble in the solvent. In one particular embodiment of the invention, the film former is selected from a group consisting of polyvinylpyrrolidone, polyvinylalcohol, sodium alginate, hydroxyethyl cellulose and combinations thereof, the rinse agent is selected from a group consisting of sodium bicarbonate, sodium hydrogen phosphate, sodium sulfate, inorganic salts and combinations thereof, and the solvent is water, an organic solvent or a combination thereof.

DETAILED DESCRIPTION OF THE INVENTION

The present invention provides a water soluble resist material for use to mask a glass surface to form desired MSVD coating patterns but it should be appreciated that other types of coatings may be used. The resist material is particularly useful for deleting selected portions of single or multilayered electroconductive coatings of the type disclosed in U.S. Pat. Nos. 3,655,545; 3,962,488 and 4,898,789.

A strippable resist material for use in forming coating patterns on a glass surface should have certain characteristics. The resist material should dry quickly without skinning so as minimize the time between applying the resist material and coating the glass surface and form a consistent, continuous resist layer. In addition, the resist material should not damage or contaminate the adjacent coating materials. The resist material should also be easily dissolvable in water, preferably without any additional scrubbing, to provide complete removal of the coating and its composition should not pose environmental hazards. Furthermore, the resist material should be able to maintain its integrity during drying and a subsequent coating operation, that is it should not burn off, evaporate, crack, bubble or otherwise allow the coating to penetrate and contact the glass surface. The materials forming the resist material should not react with the overlaying coating material in a manner that will make the resist material more difficult to remove from the glass surface. Lastly the resist material should not release any volatile or noxious gases within the coater during a coating operation.

The resist material of the present invention includes a soluble film former, a solvent, a surfactant, and a rinse aid. Because the resist material is a liquid, bands or stripes of the resist material may be applied by hand or a robot using a roll, brush, spray, ink jet or pad to form a discrete pattern, or the resist material may be applied to the glass surface using conventional pad or screen printing equipment. It should be appreciated that application by a robot provides increased flexibility in the ability to quickly change the resist coating pattern. The resist material may be air dried or force dried using ovens or fans; however care must be taken not to heat the resist in a manner that it will make it more difficult to remove the coating and resist, as will be discussed later.

The film former of the resist material provides a protective film that prevents a subsequently applied coating, e.g. an MSVD coating, from contacting and bonding to the glass surface. The film former should be water soluble so that it may be easily removed from the glass surface using conventional glass sheet washing equipment and also soluble in the solvent used to apply the film former. The solvent should be a material that will dissolve the film former, and preferably any other additional additives, and dries quickly and evenly to form a continuous resist layer. The surfactant provides improved wetting of the glass surface and better definition of the masking pattern. It is preferred that the surfactant not be of a type that will bond to the glass surface, which would make it more difficult to remove the resist material. The rinsing agent is used to enhance the water solubility of the film former so that it may be quickly and cleanly removed by water spray, as is used in conventional glass sheet washing equipment, along with the overlaying coating to form the desired pattern on the glass sheet. If required, brushes may be used in the washing equipment to supplement removal of the resist material and coating.

It should be appreciated that the surfactant and rinsing agent are not absolutely required for the masking material but their inclusion improves the quality of the deleted pattern and the ease of removal.

A resist material comprised of these components is preferably 1 to 20 weight percent film former, up to 5 weight percent rinse aid, and up to 3 weight percent surfactant, and more preferably 5 to 15 weight percent film former, 1 to 3 weight percent rinse aid and 0.1 to 1 weight percent surfactant. In one particular embodiment of the invention, the film former is polyvinylpyrrolidone, $(C_6H_9NO)_n$, (commonly referred to as PVP) which is an organic polymer film former soluble in water and organic solvents, and the solvent is an organic solvent, preferably an alcohol, and in particular 2-propanol. 2-propanol was chosen because of its quick drying, low toxicity and good wetting characteristics. The particular PVP used in this embodiment is available from GAF Chemicals Corp., NJ under the tradename PVP K-15, K-30 and K-90, with the higher number indicates a longer chain length and higher molecular weight. In the present invention, it is preferred to use a shorter chain length for increased solubility, i.e. the PVP K-15. A nonionic surfactant was used to improve wetting of the glass. In this particular embodiment, the surfactant was MAZAWET® 36 nonionic surfactant available from PPG Industries, Inc., Specialty Chemicals, Illinois, which is an alkylaryl polyethoxy benzyl ether. To enhance the water solubility of the PVP and enhance the ability to remove the coated resist using conventional glass sheet washing equipment, this particular embodiment of the invention used inorganic salts soluble in both water and the organic solvent as a rinse aid. Since this particular embodiment used an alcohol solvent, the rinse aid used was an alcohol soluble inorganic salt, e.g. ammonium acetate, ammonium nitrate and alkali acetates or nitrates. Ammonium acetate performed the best with easy application and removal and no attack of the surrounding coating. Potassium acetate provided good masking protection and ease of removal, but tended to crack when drying. The lithium nitrate applied easily and dried well but was more difficult to remove.

Examples 1 and 2 in Table I illustrate resist materials as discussed above. It was found that these resist formulations could be applied by hand using a pad and removed after air drying and coating using a hot water spray system. In particular, the coated glass preferably undergoes a prewash cycle wherein the coated glass surface is sprayed with water at a temperature of at least about 100° F. (38° C.), and preferably at least about 120° F. (49° C.), and allowed to soak for at least about 20 seconds, preferably at least about 30 seconds. This prewash cycle is followed by moving the coated sheet through a glass sheet washer which uses high temperature and high pressure Water sprays to remove the resist and overlaying coating. Although not limiting in the present invention, the water temperature should be at least about 170° F. (77° C.), and preferably at least about 185° F. (85° C.), and the water pressure should be at least about 120 psi (83 newtons/cm$^2$), and preferably at least about 165 psi (114 newtons/cm$^2$).

It is preferred that the resist material be applied at the minimum thickness required to ensure a consistent and continuous protective film that may be removed using conventional glass sheet washing equipment. However, it should be appreciated that if the thickness is too great, there may be "ghosting along the edge of the coating pattern. As discussed earlier, ghosting is a condition wherein the mask or resist material shades the glass along the coating/resist interface, causing a variation in the thickness of the deposited coating layers along the interface and resulting in an observable change in the coloration of the coating. During testing of the resist material, it was found that a dry thickness of at least about 0.030 mils (0.762 microns) provided a consistent and continuous resist layer. It is preferred that the maximum thickness be less than 2 mils (50.8 microns) to minimize ghosting.

Although it is preferred that the drying time of the resist material be minimized, care should be taken when heating a PVP containing resist material. In particular, PVP will crosslink at a temperature of about 302° F. (150° C.) and permanently insolubilize the polymer, making it very difficult to remove from the glass surface.

It should be appreciated that materials other than those discussed above may be used to form the resist. For example and not limiting in the present invention, solvents such as water, ethanol, methanol, or a mixture of water and water miscible solvents may be used and depending on the solvent used in the resist material, film formers such as polyvinylalcohol, wetting agents such as Triton® X-100 nonionic surfactant, available from Rohm and Haas Co., PA and Zonyl® fluorosurfactants available from E. I. du Pont de Nemours & Co., Inc., DE, and rinse aids such as sodium bicarbonate, sodium hydrogen phosphate and sodium sulfate may be used. Examples 3–6, which are discussed below in detail, incorporate several of these materials into the resist material as disclosed herein.

In order to apply the resist material as discussed above by screen printing, a film thickener may be added to increase the resists material's viscosity. The thickener is preferably 1 to 10 weight percent and more preferably 3 to 6 weight percent of the resist material. Although not limiting in the present invention, colloidal silica, for example CAB-O-SIL® EH-5 silica available from Cabot Corporation, Cab-O-Sil Division, IL, and hydroxyethyl cellulose (HEC), for example Cellosize® QP-300 HEC, available from Union Carbide Chemicals and Plastics Co., Inc., CT may be used. Examples 3–5 in Table I show examples of resist material using these components that may be applied by a screen printing operation. It is preferred that these screenable resists have a viscosity ranging from about 5,000–30,000 cps and more preferably from about 10,000–20,000 cps. With respect to Example 3, the resist material could be applied by screen printing; however, the silica tended to build up on the screens and clog them after repeated use. In addition, the silica tended to clog the pumps used to deliver the resist material. It is believed this is due to the insolubility of the silica in the water and 2-propanol solvent. With respect to Examples 4 and 5, the Zonyl® FSP surfactant which was added to improve wetting of the glass surface also acted as a screen release agent which reduced the sticking of resist material to the screen. The sodium bicarbonate in Examples 4 and 5 increased water solubility of the dried resist so that it could be more easily removed and rinsed of the glass surface but, in a manner similar to the silica in Example 3, tended to build up on the screen and clog it after repeated use as well as clog the pumps that delivered the resist material. It is believed that the use of a coarser mesh screen and finer particles, or the elimination of the solid particulates and the use of solvent soluble additives would minimize these problems. Furthermore, with respect to the use of HEC, it is ing. In particular, it is preferred that during the resist drying and subsequent coating operation, the resist material should be maintained at a temperature of no greater than about 300° F. (149° C.).

The invention described and illustrated herein represents a description of illustrative embodiments thereof. It is understood that various changes may be made without departing from the gist of the invention defined by the claims that follow.

TABLE 1

|  | Ex. 1 | Ex. 2 | Ex. 3 | Ex. 4 | Ex. 5 | Ex. 6 | Ex. 7 |
| --- | --- | --- | --- | --- | --- | --- | --- |
| Film Former | PVP K-15 5 wt. % | PVP K-15 10 wt. % | PVP K-30 10 wt. % | PVP K-15 10 wt. % | PVP K-15 10 wt. % | PVP K-15 2 wt. % | Kelgin F 3–3.5 wt. % |
| Rinse Aid | potassium acetate 2 wt. % | ammonium acetate 2 wt. % |  | sodium bicarbonate 1 wt. % | sodium bicarbonate 1 wt. % |  |  |
| Surfactant | Mazawet 36 1 wt. % | Mazawet 36 1 wt. % | Triton X-100 0.1 wt. % | Zonyl FSP 3 wt. % | Zonyl FSP 3 wt. % |  |  |
| Thickener |  |  | CAB-O-SIL EH-5 5 wt. % | QP-300 4 wt. % | QP-300 4 wt. % |  |  |
| Solvent | 2-propanol | 2-propanol | 50% water 50% 2-propanol | water | 50% water 50% 2-propanol | 50% water 50% 2-propanol | weter | believed that the HEC in combination with the PVP contributed to the film forming properties of the resist material and that the HEC by itself may be used as a film former in a resist material of the type disclosed in the present invention.

Testing of a resist material of the type shown in Examples 4 and 5 also indicated that the HEC became insoluble in water at higher temperatures and formed insoluble compounds with metal ions from the coating. As a result, the resist was difficult to remove and there was excessive residue after washing to remove the coating and resist material. To avoid this condition, the PVP film former and HEC thickener were replaced with sodium alginate, and in particular Kelgin® F and Kelgin® HV sodium alginate available from KELCO Division of Merck & Co., Inc., CA. The sodium alginate acts as the film former and may be mixed with water to provide the viscosity required to apply the resist by hand or robot or by a screen printing operation. In particular, the sodium alginate is preferably 1 to 5 weight percent and more preferably 3 to 4 weight percent of the resist material. If desired, PVP may be added to the sodium alginate to provide the film former; however preliminary testing indicated that the addition of the PVP may reduce the solubility of the sodium alginate in water. In evaluating this resist material as a screenable resist, it was found that a resist having 3–3.5 wt. % Kelgin® F sodium alginate provided good definition of a desired coating pattern and could be removed using standard glass washer equipment. However, it was difficult to maintain a consistent viscosity and the sodium alginate resist tended to clog the screens. In addition, it was observed that the resist formed a gel when exposed to high temperature water, thus making it more difficult to remove at higher water temperatures. It was also found that the sodium alginate/water resist had a limited shelf life so that the resist should be applied within 24 hours after mixing the materials.

Due to the organic nature of the constituents of the resist material disclosed herein, the resist material should not be exposed to high temperature so as to ensure that the resist does not decompose prior to applying the overlaying coat-

We claim:

1. A strippable resist material for masking selected portions of a glass substrate to form a desired coating pattern, the resist material comprising 5–15 wt. % polymer film former, 0.1–1 wt. % surfactant, 1–3 wt. % rinse aid and a solvent, wherein said film former, surfactant and rinse aid are soluble in water and in said solvent, said film former is selected from a group consisting of polyvinylpyrrolidone, polyvinylalcohol, sodium alginate, hydroxyethyl cellulose and combinations thereof, said rinse aid is selected from a group consisting of sodium bicarbonate, sodium hydrogen phosphate, sodium sulfate, inorganic salts and combinations thereof, and said solvent is selected from a group consisting of an alcohol and a mixture of an alcohol and water.

2. The resist material as in claim 1 wherein said inorganic salts are selected from a group consisting of ammonium acetate, ammonium nitrate, alkali acetates, alkali nitrates and combinations thereof.

3. The resist material as in claim 1 wherein said resist material has a viscosity of about 5,000–30,000 cps.

4. The resist material as in claim 3 further including a thickener to increase said viscosity of said resist material within said range.

5. The resist material as in claim 4 wherein said thickener is selected from the group consisting of silica, hydroxyethyl cellulose, and combinations thereof.

6. The resist material as in claim 4 further including 1–10 wt. % thickener.

7. A strippable resist material for masking selected portions of a glass sheet to form a desired coating pattern, the resist material comprising 1–20 wt. % film former consisting of polyvinylpyrrolidone, 0.1–3 wt. % surfactant, 1–5 wt. % rinse aid selected from a group consisting of sodium bicarbonate, sodium hydrogen phosphate, sodium sulfate, inorganic salts and combinations thereof, and a solvent selected from a group consisting of 2-propanol and a mixture of 2-propanol and water, wherein said film former, said surfactant and said rinse aid are soluble in both water and 2-propanol.

8. The resist material as in claim 7 wherein said material includes 5–15 wt. % water soluble film former, 0.1–1 wt. % surfactant, and 1–3 wt. % rinse aid.

9. The resist material as in claim 8 wherein said inorganic salts are selected from a group consisting of ammonium acetate, ammonium nitrate, alkali acetates, alkali nitrates and combinations thereof.

10. The resist material as in claim 8 wherein said resist material has a viscosity of about 5,000–30,000 cps.

11. The resist material as in claim 10 further including a thickener to increase said viscosity of said resist material within said range.

12. The resist material as in claim 11 wherein said thickener is selected from the group consisting of silica, hydroxyethyl cellulose, and combinations thereof.

13. The resist material as in claim 12 further including 1–10 wt. % thickener.

* * * * *